United States Patent
Nirschl et al.

(10) Patent No.: US 7,345,899 B2
(45) Date of Patent: Mar. 18, 2008

(54) MEMORY HAVING STORAGE LOCATIONS WITHIN A COMMON VOLUME OF PHASE CHANGE MATERIAL

(75) Inventors: Thomas Nirschl, Essex Junction, VT (US); Thomas Happ, Tarrytown, NY (US); Jan Boris Philipp, Peekskill, NY (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/400,742

(22) Filed: Apr. 7, 2006

(65) Prior Publication Data

US 2007/0247898 A1 Oct. 25, 2007

(51) Int. Cl.
*G11C 5/06* (2006.01)
(52) U.S. Cl. .................. 365/63; 365/158; 365/145; 365/151; 365/66; 365/65; 365/72
(58) Field of Classification Search ............. 365/158, 365/145, 151, 63, 66, 65, 72; 257/295
See application file for complete search history.

(56) References Cited

U.S. PATENT DOCUMENTS

| | | | |
|---|---|---|---|
| 6,501,111 B1 | 12/2002 | Lowrey | |
| 6,504,742 B1 | 1/2003 | Tran et al. | |
| 6,567,296 B1 * | 5/2003 | Casagrande et al. | 365/105 |
| 6,737,312 B2 | 5/2004 | Moore | |
| 6,744,088 B1 * | 6/2004 | Dennison | 257/296 |
| 6,764,894 B2 * | 7/2004 | Lowrey | 438/238 |
| 6,795,338 B2 * | 9/2004 | Parkinson et al. | 365/163 |
| 6,914,255 B2 * | 7/2005 | Lowrey | 257/5 |
| 6,943,395 B2 * | 9/2005 | Oh et al. | 257/295 |
| 7,009,694 B2 * | 3/2006 | Hart et al. | 365/163 |
| 7,038,261 B2 * | 5/2006 | Horii | 257/295 |
| 7,042,749 B2 * | 5/2006 | Nejad et al. | 365/63 |
| 7,126,149 B2 * | 10/2006 | Iwasaki et al. | 257/3 |
| 7,212,432 B2 * | 5/2007 | Ferrant et al. | 365/158 |
| 7,223,693 B2 * | 5/2007 | Choi et al. | 438/672 |
| 2003/0001230 A1 | 1/2003 | Lowrey | |
| 2004/0262635 A1 | 12/2004 | Lee | |
| 2005/0112896 A1 | 5/2005 | Hamann et al. | |

OTHER PUBLICATIONS

S.J. Ahn et al., "Highly Reliable 50nm Contact Cell Technology for 256Mb PRAM" VLSI 2005.
M. Gill et al., "Ovonics Unified Memory—A High Performance Nonvolatile Memory Technology for Stand Alone Memory and Embedded Applications", ISSCC, 2002.
E. Maayan et al., "A 512Mb NROM Data Storage Memory with 8MB/s data rate", ISSCC, 2002.
B. Eitan et al., "Can NROM, a 2 Bit, Trapping Storage NVM Cell, Give a Real Challenge to Floating Gate Cells?" ICSSDM, 1999 (3 pages).

* cited by examiner

*Primary Examiner*—Viet Q. Nguyen
(74) *Attorney, Agent, or Firm*—Dicke, Billig & Czaja, PLLC

(57) ABSTRACT

A memory includes a volume of phase change material, a first transistor coupled to the volume of phase change material for accessing a first storage location within the volume of phase change material, and a second transistor coupled to the volume of phase change material for accessing a second storage location within the volume of phase change material.

21 Claims, 4 Drawing Sheets

US 7,345,899 B2

MEMORY HAVING STORAGE LOCATIONS WITHIN A COMMON VOLUME OF PHASE CHANGE MATERIAL

BACKGROUND

One type of non-volatile memory is resistive memory. Resistive memory utilizes the resistance value of a memory element to store one or more bits of data. For example, a memory element programmed to have a high resistance value may represent a logic "1" data bit value, and a memory element programmed to have a low resistance value may represent a logic "0" data bit value. The resistance value of the memory element is switched electrically by applying a voltage pulse or a current pulse to the memory element. One type of resistive memory is phase change memory. Phase change memory uses a phase change material for the resistive memory element.

Phase change memories are based on phase change materials that exhibit at least two different states. Phase change material may be used in memory cells to store bits of data. The states of phase change material may be referred to as amorphous and crystalline states. The states may be distinguished because the amorphous state generally exhibits higher resistivity than does the crystalline state. Generally, the amorphous state involves a more disordered atomic structure, while the crystalline state involves a more ordered lattice. Some phase change materials exhibit more than one crystalline state, e.g. a face-centered cubic (FCC) state and a hexagonal closest packing (HCP) state. These two crystalline states have different resistivities and may be used to store bits of data.

Phase change in the phase change materials may be induced reversibly. In this way, the memory may change from the amorphous state to the crystalline state and from the crystalline state to the amorphous state in response to temperature changes. The temperature changes to the phase change material may be achieved in a variety of ways. For example, a laser can be directed to the phase change material, current may be driven through the phase change material, or current can be fed through a resistive heater adjacent the phase change material. In any of these methods, controllable heating of the phase change material causes controllable phase change within the phase change material.

A phase change memory including a memory array having a plurality of memory cells that are made of phase change material may be programmed to store data utilizing the memory states of the phase change material. One way to read and write data in such a phase change memory device is to control a current and/or a voltage pulse that is applied to the phase change material. The level of current and/or voltage generally corresponds to the temperature induced within the phase change material in each memory cell.

For data storage applications, reducing the physical memory cell size is a continuing goal. Reducing the physical memory cell size increases the storage density of the memory and reduces the cost of the memory.

For these and other reasons, there is a need for the present invention.

SUMMARY

One embodiment of the present invention provides a memory. The memory includes a volume of phase change material, a first transistor coupled to the volume of phase change material for accessing a first storage location within the volume of phase change material, and a second transistor coupled to the volume of phase change material for accessing a second storage location within the volume of phase change material.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
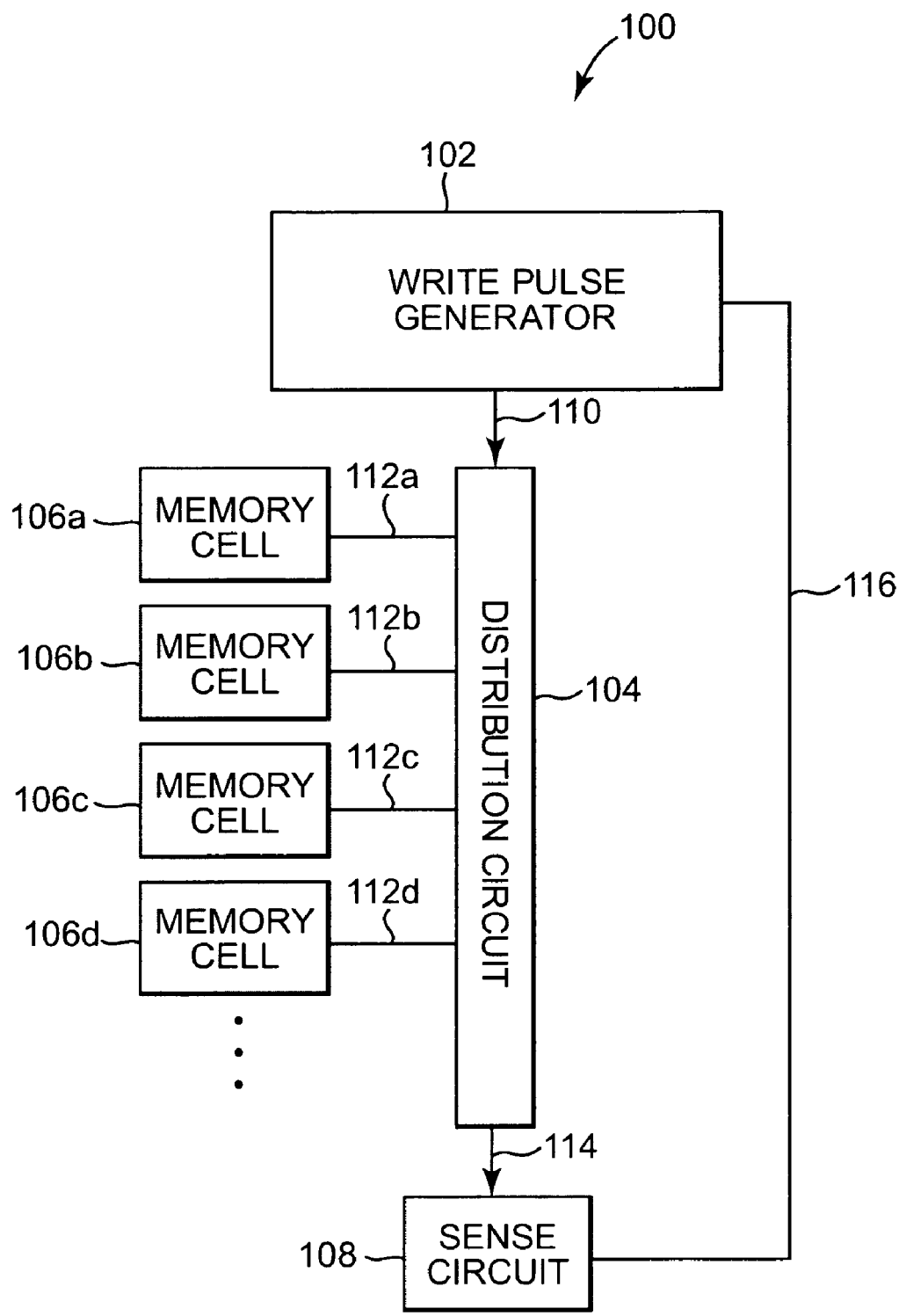
FIG. 1 is a block diagram illustrating one embodiment of a memory device.

FIG. 1 is a block diagram illustrating one embodiment of a memory device 100. Memory device 100 includes a write pulse generator 102, a distribution circuit 104, memory cells 106a, 106b, 106c, and 106d, and a sense circuit 108. Memory cells 106a-106d are phase change memory cells that are based on the amorphous to crystalline phase transition of the memory material in the memory cell.

Memory device 100 includes a three dimensional array of memory cells. Multiple two dimensional arrays of memory cells are stacked atop each other to provide the three dimensional array of memory cells. Groups of memory cells within the three dimensional array of memory cells share a common volume of phase change material. Each common volume of phase change material provides multiple phase change material portions that provide storage locations for storing one bit or multiple bits of data. Each phase change material portion is electrically coupled to an access device for accessing the phase change material portion for read and write operations. The access device for each memory cell helps to improve signal integrity and reduce power consumption by significantly reducing leakage current during write operations as compared to a cross-point memory array architecture.

Each common volume of phase change material may run vertically, horizontally, or combined vertically and horizontally in the three dimensional array of memory cells. In one embodiment, each common volume of phase change material is a vertical column of material or "super via." The phase change material super via transects the stacked two dimensional arrays of memory cells to provide storage locations for memory cells within each one of the two dimensional arrays within the stack. In one embodiment, the center or core of the phase change material super via is a conductive material. In one embodiment, two opposite sides of each phase change material super via within one layer of the stack of two dimensional arrays of memory cells provide two storage locations. Each of the two storage locations stores one bit or several bits of data. In another embodiment, four sides of each phase change material super via within one layer of the stack of two dimensional arrays of memory cells provide four storage locations. Each of the four storage locations stores one bit or several bits of data.

In one embodiment, each two dimensional array of memory cells within the three dimensional array of memory cells has its own bit lines and word lines for accessing the memory cells within the two dimensional array of memory cells. In this embodiment, memory cells sharing a common phase change material super via can be accessed simultaneously since neither bit lines nor word lines are shared, which allow separate control of each memory cell during read and write operations. In another embodiment, a single set of bit lines and/or word lines are shared by the memory cells sharing a common phase change material super via within the three dimensional array of memory cells.

As used herein, the term "electrically coupled" is not meant to mean that the elements must be directly coupled together and intervening elements may be provided between the "electrically coupled" elements.

In one embodiment, write pulse generator 102 generates current or voltage pulses that are controllably directed to memory cells 106a-106d via distribution circuit 104. In one embodiment, distribution circuit 104 includes a plurality of transistors that controllably direct current or voltage pulses to the memory cells. Write pulse generator 102 is electrically coupled to distribution circuit 104 through signal path 110. Distribution circuit 104 is electrically coupled to each of the memory cells 106a-106d through signal paths 112a-112d. Distribution circuit 104 is electrically coupled to memory cell 106a through signal path 112a. Distribution circuit 104 is electrically coupled to memory cell 106b through signal path 112b. Distribution circuit 104 is electrically coupled to memory cell 106c through signal path 112c. Distribution circuit 104 is electrically coupled to memory cell 106d through signal path 112d. In addition, distribution circuit 104 is electrically coupled to sense circuit 108 through signal path 114, and sense circuit 108 is electrically coupled to write pulse generator 102 through signal path 116.

Sense circuit 108 senses the state of the memory cells 106a-106d and provides signals that indicate the state of the resistance of the memory cells 106a-106d. Sense circuit 108 reads each state of memory cells 106a-106d through signal path 114. Distribution circuit 104 controllably directs read signals between sense circuit 108 and memory cells 106a-106d through signal paths 112a-112d. In one embodiment, distribution circuit 104 includes a plurality of transistors that controllably direct read signals between sense circuit 108 and memory cells 106a-106d.

In one embodiment, memory cells 106a-106d include a phase change material that may be changed from an amorphous state to a crystalline state or from a crystalline state to an amorphous state under influence of temperature change. The degree of crystallinity thereby defines at least two memory states for storing data within memory device 100. The at least two memory states can be assigned to the bit values "0" and "1". The bit states of memory cells 106a-106d differ significantly in their electrical resistivity. In the amorphous state, a phase change material exhibits significantly higher resistivity than in the crystalline state. In this way, sense amplifier 108 reads the cell resistance such that the bit value assigned to a particular memory cell 106a-106d is determined.

To program a memory cell 106a-106d within memory device 100, write pulse generator 102 generates a current or voltage pulse for heating the phase change material in the target memory cell. In one embodiment, write pulse generator 102 generates an appropriate current or voltage pulse, which is fed into distribution circuit 104 and distributed to the appropriate target memory cell 106a-106d. The current or voltage pulse amplitude and duration is controlled depending on whether the memory cell is being set or reset. Generally, a "set" operation of a memory cell is heating the phase change material of the target memory cell above its crystallization temperature (but below its melting temperature) long enough to achieve the crystalline state. Generally, a "reset" operation of a memory cell is heating the phase change material of the target memory cell above its melting temperature, and then quickly quench cooling the material, thereby achieving the amorphous state.

Figure 2:
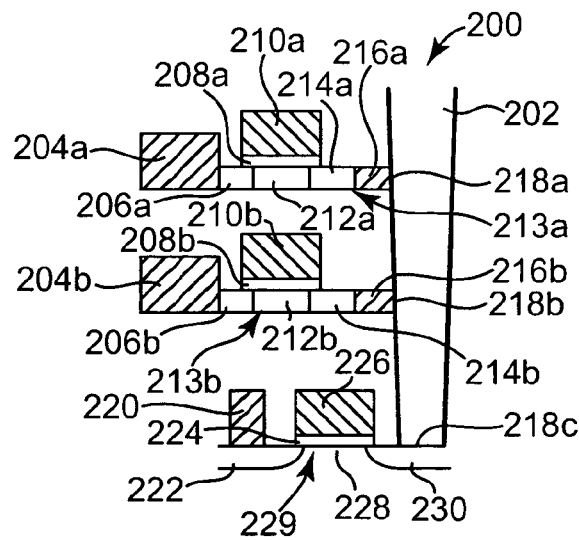
FIG. 2 illustrates a side view of one embodiment of a stacked phase change memory.

FIG. 2 illustrates a side view of one embodiment of a stacked phase change memory 200. Stacked phase change memory 200 includes phase change material super via 202, contacts or heaters 216a and 216b, conductive lines 204a, 204b, and 220, word lines 210a and 210b, select line 226, and transistors 213a, 213b, and 229. Transistor 213a includes one of a source and a drain 206a and the other of the source and the drain 214a, channel 212a, and gate 208a. Transistor 213b includes one of a source and a drain 206b and the other of the source and the drain 214b, channel 212b, and gate 208b. Transistor 229 includes one of a source and a drain 222 and the other of the source and the drain 230, channel 228, and gate 224.

Conductive line 204a is electrically coupled to side 206a of the source-drain path of transistor 213a. Gate 208a of transistor 213a is electrically coupled to word line 210a. Side 214a of the source-drain source path of transistor 213a is electrically coupled to contact or heater 216a. Contact or heater 216a contacts phase change material super via 202 at 218a.

Conductive line 204b is electrically coupled to side 206b of the source-drain path of transistor 213b. Gate 208b of transistor 213b is electrically coupled to word line 210b. Side 214b of the source-drain source path of transistor 213b is electrically coupled to contact or heater 216b. Contact or heater 216b contacts phase change material super via 202 at 218b.

Conductive line 222 is electrically coupled to side 222 of the source-drain path of transistor 229. Gate 224 of transistor 229 is electrically coupled to select line 226. Side 230 of the source-drain source path of transistor 229 is electrically coupled to the bottom of phase change material super via 202 at 218c.

Phase change material super via 202 is substantially in the crystalline state. The portions of phase change material at 218a and 218b at the interfaces between contacts or heaters 216a and 216b and phase change material super via 202 provide storage locations. The storage locations change state from crystalline to amorphous and from amorphous to crystalline in response to temperature changes. The remainder and bulk of phase change material super via 202 remains in the crystalline state, such that the storage location at 218a is independent from the storage location at 218b. The state of the storage location at 218a does not affect read or write operations to the storage location at 218b, and the state of the storage location at 218b does not affect read or write operations to the storage location at 218a.

Phase change material super via 202 may be made up of a variety of materials in accordance with the present invention. Generally, chalcogenide alloys that contain one or more elements from group VI of the periodic table are useful as such materials. In one embodiment, phase change material super via 202 is made up of a chalcogenide compound material, such as GeSbTe, SbTe, GeTe, or AgInSbTe. In another embodiment, phase change material super via 202 is chalcogen free, such as GeSb, GaSb, InSb, or GeGaInSb. In other embodiments, phase change material super via 202 is made up of any suitable material including one or more of the elements Ge, Sb, Te, Ga, As, In, Se, and S. In another embodiment, the super via includes a stack of different phase change materials or differently doped phase change material regions. In one embodiment, the phase change material for phase change material super via 202 is deposited after the transistors 213a and 213b have been fabricated.

In one embodiment, conductive lines 204a and 204b are bit lines. In another embodiment, conductive lines 204a and 204b are common or ground lines. Transistor 213a is an access device for accessing storage location 218a at the interface between heater 216a and phase change material super via 202. In response to a logic high signal on word line 210a, transistor 213a turns on to pass a signal between conductive line 204a and storage location 218a to set, reset, or read storage location 218a. In response to a logic low signal on word line 210a, transistor 213a turns off.

Transistor 213b provides an access device for accessing storage location 218b at the interface between heater 216b and phase change material super via 202. In response to a logic high signal on word line 210b, transistor 213b turns on to pass a signal between conductive line 204b and storage location 218b to set, reset, or read storage location 218b. In response to a logic low signal on word line 210a, transistor 213a turns off.

Contacts or heaters 218a and 218b comprise TiN, TaN, W, Al, Cu, TiSiN, TaSiN, or other suitable contact or heater material. With transistor 210a turned on and in response to a write signal, the phase change material at storage location 218a is heated to set or reset the phase change material. With transistor 210b turned on and in response to a write signal, the phase change material at storage location 218b is heated to set or reset the phase change material.

In one embodiment, transistor 229 is a page select device. In response to a logic high signal on select line 226, transistor 229 turns on to pass a current or voltage signal between conductive line 220 and phase change material super via 202. In one embodiment, conductive line 220 is a common or ground line and transistor 226 turns on to enable storage locations 218a and 218b to be set, reset, or read by providing a current path to ground. In another embodiment, conductive line 220 is a source line and transistor 226 turns on to enable storage locations 218a and 218b to be set, reset, or read by providing a common source. In another embodiment, transistor 229 is another access device for accessing a storage location at the bottom of phase change material super via 202 at 218c. In one embodiment, a contact or heater is electrically coupled between transistor 229 and phase change material super via 202.

In operation of one embodiment of stacked phase change memory 200, transistor 229 is turned on by applying a logic high signal on select line 226 to enable storage locations 218a and 218b for access. To access storage location 218a, transistor 213a is turned on by applying a logic high signal on word line 210a to set, reset, or read the data stored in storage location 218a. Storage location 218a is set by heating the phase change material portion at the interface between contact or heater 216a and phase change material super via 202 above its crystallization temperature (but below its melting temperature) long enough to achieve the crystalline state. Storage location 218a is reset by heating the phase change material portion at the interface between contact or heater 216a and phase change material super via 202 above its melting temperature, and then quickly quench cooling the material, thereby achieving the amorphous state.

Storage location 218a is read by applying a voltage and/or current signal to the phase change material portion at the interface between contact or heater 216a and phase change material super via 202. Sense circuit 108 senses the current and/or voltage through the phase change material portion to determine the resistance and thus the data stored in storage location 218a. Other storage locations within stacked phase change memory 200, such as storage location 218b, are accessed in a similar manner as storage location 218a.

While two storage locations at 218a and 218b are illustrated, any suitable number of additional storage locations can be provided within phase change material super via 202 in layers stacked above the layer hosting transistor 213a. In addition, any suitable number of phase change material super vias 202 can be used in stacked phase change memory 200 to provide the three dimensional array of memory cells.

Figure 3:
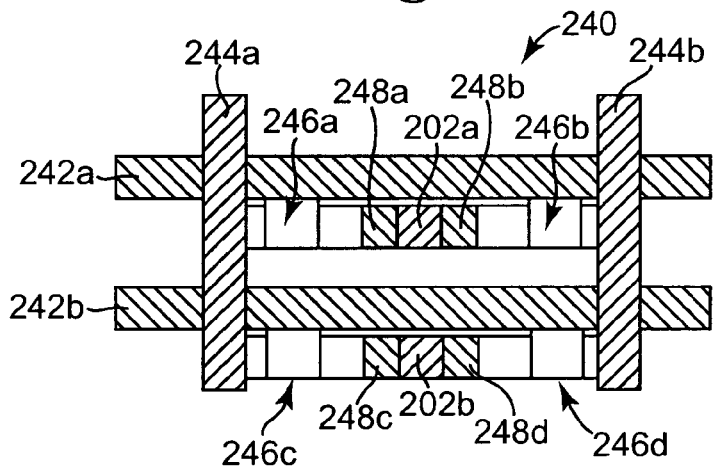
FIG. 3 illustrates a top view of one embodiment of one layer of a stacked phase change memory.

FIG. 3 illustrates a top view of one embodiment of one layer 240 of a stacked phase change memory, such as stacked phase change memory 200. Layer 240 includes word lines 242a and 242b, bit lines 244a and 244b, transistors 246a-246d, contacts or heaters 248a-248d, and phase change material super vias 202a and 202b. Any suitable number of layers 240 can be stacked atop each other to provide a three dimensional array of phase change memory cells. Each of the layers 240 share phase change material super vias 202a and 202b.

One side of word line 242a is electrically coupled to the gate of transistor 246a and the gate of transistor 246b. One side of word line 242b is electrically coupled to the gate of transistor 246c and the gate of transistor 246d. Bit line 244a is electrically coupled to one side of the source-drain path of transistor 246a and one side of the source-drain path of transistor 246c. Bit line 244b is electrically coupled to one side of the source-drain path of transistor 246b and one side of the source-drain path of transistor 246d.

The other side of the source-drain path of transistor 246a is electrically coupled to one side of contact or heater 248a. The other side of contact or heater 248a contacts a first side of phase change material super via 202a. The other side of the source-drain path of transistor 246b is electrically coupled to one side of contact or heater 248b. The other side of contact or heater 248b contacts a second side of phase change material super via 202a opposite the first side of phase change material super via 202a.

The other side of the source-drain path of transistor 246c is electrically coupled to one side of contact or heater 248c. The other side of contact or heater 248c contacts a first side of phase change material super via 202b. The other side of the source-drain path of transistor 246d is electrically coupled to one side of contact or heater 248d. The other side of contact or heater 248d contacts a second side of phase change material super via 202b opposite the first side of phase change material super via 202b.

Bit lines 244a and 244b are perpendicular to words lines 242a and 242b. In one embodiment, bit lines 244a and 244b are in a first interconnect layer and word lines 242a and 242b are in a second interconnect layer below the first interconnect layer. In another embodiment, bit lines 244a and 244b are in a first interconnect layer and word lines 242a and 242b are in a second interconnect layer above the first interconnect layer. Transistor 246a is an access device for accessing a storage location at the interface between contact or heater 248a and phase change material super via 202a. In response to a logic signal on word line 242a, transistor 246a turns on to pass a signal between bit line 244a and phase change material super via 202a to set, reset, or read the state of a phase change material portion at the interface between contact or heater 248a and phase change material super via 202a. In response to a difference logic signal on word line 242a, transistor 246a turns off. Transistors 246b, 246c, and 246d operate similarly to transistor 246a for accessing storage locations at the interfaces between contacts or heaters 248b, 248c, and 248d and phase change material super vias 202a and 202b.

Figure 4:
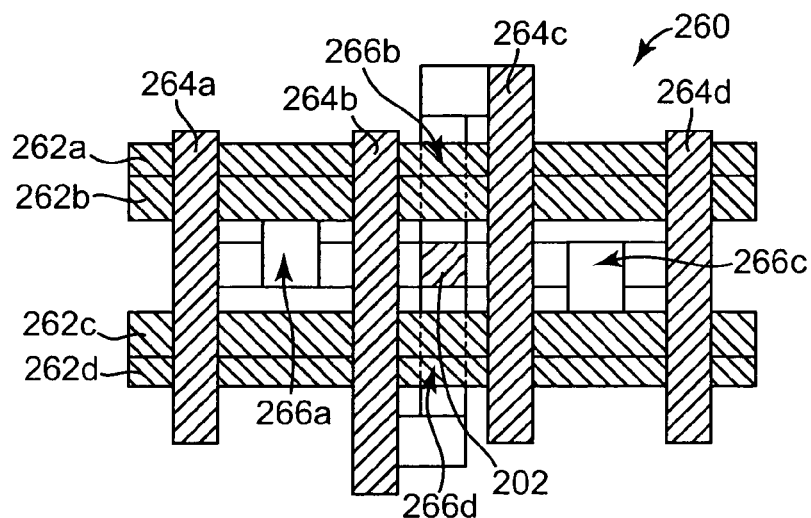
FIG. 4 illustrates a top view of another embodiment of one layer of a stacked phase change memory.

FIG. 4 illustrates a top view of another embodiment of one layer 260 of a stacked phase change memory. Layer 260 includes word lines 262a-262d, bit lines 264a-264d, transistors 266a-266d, and phase change material super via 202. Any suitable number of layers 260 can be stacked atop each other to provide a three dimensional array of phase change memory cells. Each of the layers 260 share phase change material super via 202.

The bottom of word line 262a is electrically coupled to the gate of transistor 266b. One side of word line 262b is electrically coupled to the gate of transistor 266a. One side of word line 262c is electrically coupled to the gate of transistor 266c. The bottom of word line 262d is electrically coupled to the gate of transistor 266d. The source-drain path of transistor 266a is electrically coupled between bit line 264a and a first side of phase change material super via 202. In one embodiment, transistor 266a is electrically coupled to the first side of phase change material super via 202 through a contact or heater. The source-drain path of transistor 266b is electrically coupled between bit line 264c and a second side of phase change material super via 202 perpendicular to the first side of phase change material super via 202. In one embodiment, transistor 266b is electrically coupled to the second side of phase change material super via 202 through a contact or heater.

The source-drain path of transistor 266c is electrically coupled between bit line 264d and a third side of phase change material super via 202 opposite the first side of phase change material super via 202. In one embodiment, transistor 266c is electrically coupled to the third side of phase change material super via 202 through a contact or heater. The source-drain path of transistor 266d is electrically coupled between bit line 264b and a fourth side of phase change material super via 202 opposite the second side of phase change material super via 202. In one embodiment, transistor 266d is electrically coupled to the fourth side of phase change material super via 202 through a contact or heater.

Each of the four sides of phase change material super via 202 provides a storage location for storing one bit or several bits of data. Layer 260 provides four storage locations per phase change material super via 202 in a star configuration. Bit lines 264a-264d are perpendicular to words lines 262a-262d. In one embodiment, bit lines 264a-264d are in a first interconnect layer. Word lines 262b and 262c are in a second interconnect layer below the first interconnect layer, and word lines 262a and 262d are in a third interconnect layer below the second interconnect layer. In another embodiment, the third interconnect layer is above the second interconnect layer. In another embodiment, words lines 262a-262d are in the same interconnect layer. Transistors 266a-266d operate similarly to transistor 246a for accessing storage locations within phase change material super via 202 as previously described and illustrated with reference to FIG. 3.

Figure 5:
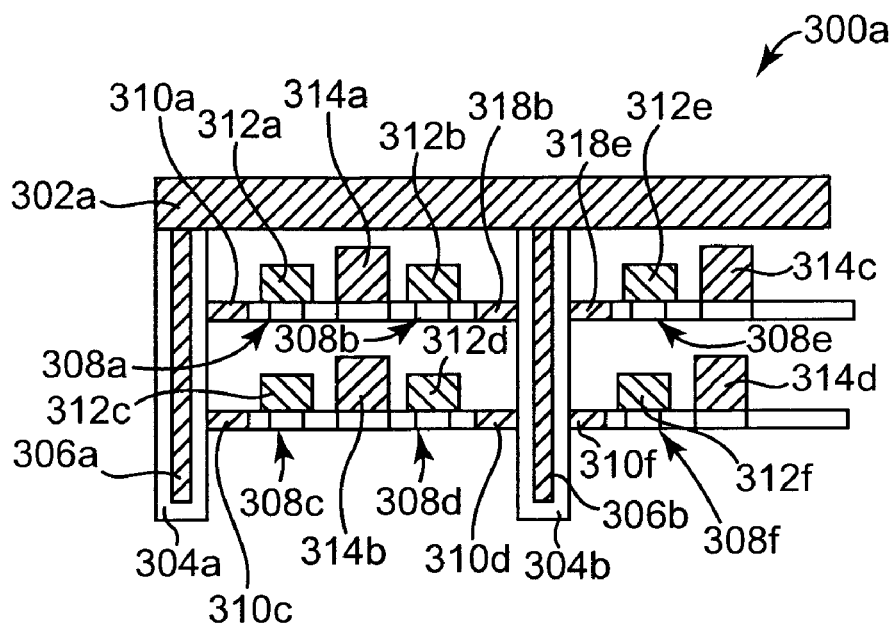
FIG. 5 illustrates a side view of another embodiment of a stacked phase change memory.

FIG. 5 illustrates a side view of another embodiment of a stacked phase change memory 300a. Stacked phase change memory 300a includes bit line 302a, phase change material super via 304a including a conductive core 306a, phase change material super via 304b including a conductive core 306b, transistors 308a-308f, word lines 312a-312f, common or ground lines 314a-314d, and contacts or heaters 310a-310f. In one embodiment, phase change material super via 304a and phase change material super via 304b each include a stack of at least two different phase change materials or differently doped phase change material regions. In one embodiment, conductive core 306a and conductive core 306b each include a stack of at least two conductive materials. The stack of phase change materials and conductive core materials are arranged concentrically, at an angle (e.g., cone shaped), in horizontal layers, or in another suitable configuration.

Bit line 302a is electrically coupled to the top of phase change material super vias 304a and 304b including conductive cores 306a and 306b. Phase change material super via 304a contacts one side of contact or heater 310a and one side of contact or heater 310c. The other side of contact or heater 310a is electrically coupled to one side of the source-drain path of transistor 308a. The gate of transistor 308a is electrically coupled to word line 312a. The other side of the source-drain path of transistor 308a is electrically coupled to common or ground line 314a. Common or ground line 314a is electrically coupled to one side of the source-drain path of transistor 308b. The gate of transistor 308b is electrically coupled to word line 312b. The other side of the source-drain path of transistor 308b is electrically coupled to one side of contact or heater 310b. The other side of contact or heater 310b contacts one side of phase change material super via 304b. The other side of phase change material super via 304b contacts one side of contact or heater 310e. The other side of contact or heater 310e is electrically coupled to one side of the source-drain path of transistor 308e. The gate of transistor 308e is electrically coupled to word line 312e. The other side of the source-drain path of transistor 308e is electrically coupled to common or ground line 314c.

The other side of contact or heater 310c is electrically coupled to one side of the source-drain path of transistor 308c. The gate of transistor 308c is electrically coupled to word line 312c. The other side of the source-drain path of transistor 308c is electrically coupled to common or ground line 314b. Common or ground line 314b is electrically coupled to one side of the source-drain path of transistor 308d. The gate of transistor 308d is electrically coupled to word line 312d. The other side of the source-drain path of transistor 308d is electrically coupled to one side of contact or heater 310d. The other side of contact or heater 310d contacts one side of phase change material super via 304b. The other side of phase change material super via 304b contacts one side of contact or heater 310f. The other side of contact or heater 310f is electrically coupled to one side of the source-drain path of transistor 308f. The gate of transistor 308f is electrically coupled to word line 312f. The other side of the source-drain path of transistor 308f is electrically coupled to common or ground line 314d.

In one embodiment, conductive cores 306a and 306b are TiN, TaN, W, Al, Cu, TiSiN, TaSiN, or other suitable conductive material having a resistance less than the resistance of the phase change material of phase change material super vias 304a and 304b in the crystalline state. In another embodiment, conductive cores 306a and 306b are formed by a suitable concentric layer stack, such as Ti/TiN/W. Conductive cores 306a and 306b are electrodes, which pass current between bit line 302a and contacts or heaters 310a-310f, such that current only passes through the phase change material directly between conductive cores 306a and 306b and contacts or heaters 310a-310f. Transistors 308a-308f operate similarly to transistor 246a for accessing storage locations within phase change material super vias 304a and 304b as previously described and illustrated with reference to FIG. 3.

Figure 6:
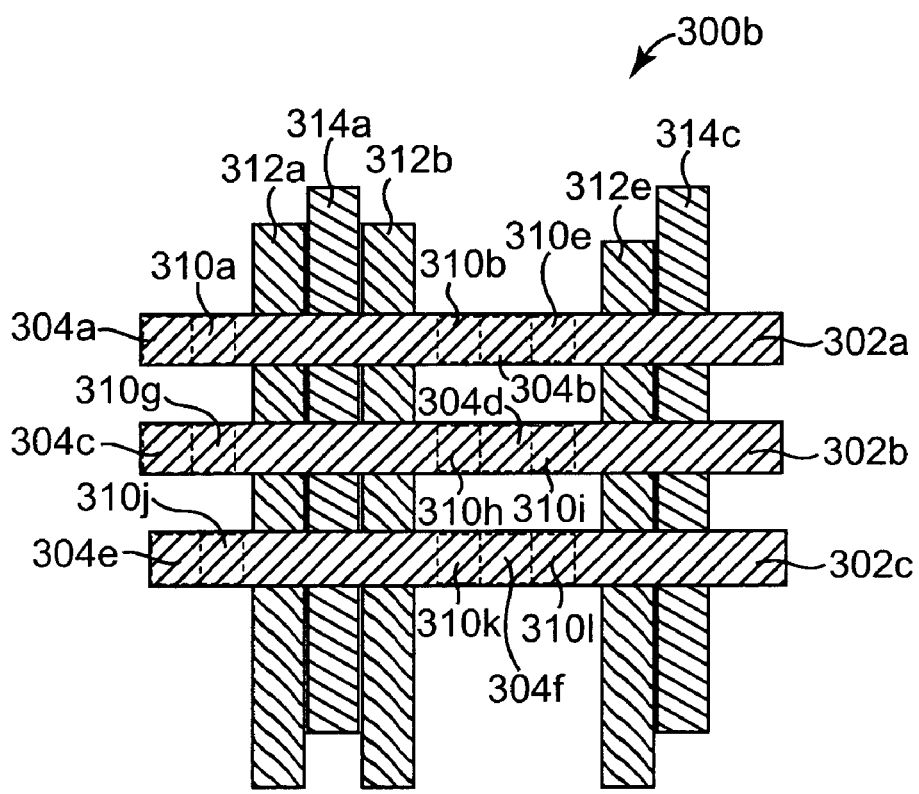
FIG. 6 illustrates a top view of one layer of the embodiment of the stacked phase change memory illustrated in FIG. 5.

FIG. 6 illustrates a top view of one layer 300b of stacked phase change memory 300a. Layer 300b includes bit lines 302a-302c, word lines 312a, 312b, and 312e, common or ground lines 314a and 314c, phase change material super vias 304a-304f, contacts or heaters 310a, 310b, 310e, and 310g-310l. Any suitable number of layers 300b can be stacked atop each other to provide a three dimensional array of phase change memory cells. Each of the layers 300b share phase change material super vias 304a-304f and bit lines 302a-302c.

Bit line 302a is electrically coupled to the tops of phase change material super vias 304a and 304b. Bit line 302b is electrically coupled to the tops of phase change material super vias 304c and 304d. Bit line 302c is electrically coupled to the tops of phase change material super vias 304e and 304f. Word line 312a is electrically coupled to the gates of access transistors, such as access transistor 308a. Likewise, word lines 312b and 312e are also electrically coupled to the gates of access transistors. Common or ground line 314a is electrically coupled to one side of the source-drain path of access transistors, such as access transistors 308a and 308b. Likewise, common or ground line 314c is also electrically coupled to one side of the source-drain path of access transistors.

Contact or heater 310a contacts one side of phase change material super via 304a. Contact or heater 310b contacts a first side of phase change material super via 304b, and contact or heater 310e contacts a second side of phase change material super via 304b opposite the first side of phase change material super via 304b. Contact or heater 310g contacts one side of phase change material super via 304c. Contact or heater 310h contacts a first side of phase change material super via 304d, and contact or heater 310i contacts a second side of phase change material super via 304d opposite the first side of phase change material super via 304d. Contact or heater 310j contacts one side of phase change material super via 304e. Contact or heater 310k contacts a first side of phase change material super via 304f, and contact or heater 310l contacts a second side of phase change material super via 304f opposite the first side of phase change material super via 304f.

Bit lines 302a-302c are shared by all layers 300b within stacked phase change memory 300a. In one embodiment, bit lines 302a-302c are perpendicular to common or ground lines 312a, 312b, and 312e, and word lines 314a and 314c. In another embodiment, bit lines 302a-302c are parallel to common or ground line 312a, 312b, and 312e, and word lines 314a and 314c. Bit lines 302a-302c are in a first interconnect layer. Word lines 312a, 312b, and 312e and common or ground lines 314a and 314c are in a second interconnect layer below the first interconnect layer.

Figure 7:
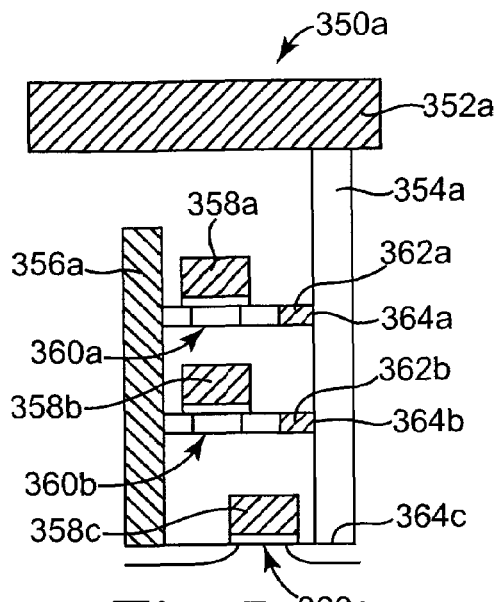
FIG. 7 illustrates a side view of another embodiment of a stacked phase change memory.

FIG. 7 illustrates a side view of another embodiment of a stacked phase change memory 350a. Stacked phase change memory 350a includes bit line 352a, phase change material super via 354a, common or ground 356a, transistors 360a-360c, word lines 358a-358c, and contacts or heaters 362a and 362b. Word line 358a is electrically coupled to the gate of transistor 360a. The source-drain path of transistor 360a is electrically coupled between common or ground 356a and one side of contact or heater 362a. The other side of contact or heater 362a contacts phase change material super via 354a at 364a. The gate of transistor 360b is electrically coupled to word line 358b. The source-drain path of transistor 360b is electrically coupled between common or ground 356a and one side of contact or heater 362b. The other side of contact or heater 362b contacts phase change material super via 354a at 364b. Word line 358c is electrically coupled to the gate of transistor 360c. The source-drain path of transistor 360c is electrically coupled between common or ground 356a and the bottom of phase change material super via 354a at 364c. In one embodiment, transistor 360c is electrically coupled to phase change material super via 354a through a contact or heater.

Bit line 352a is electrically coupled to the top of phase change material super via 354a. Common or ground 356a is shared by the layers within stacked phase change memory 350a. In one embodiment, common or ground 356a is a conductive via. In another embodiment, common or ground 356a is a conductive plate of material. One transistor within a layer coupled to phase change material super via 354a, such as transistor 360a, is operated at a time to read or write data at a storage location within phase change material super via 354a, such as storage location 364a. Transistors 360a-360c operate similarly to transistor 246a for accessing storage locations within phase change material super via 354a as previously described and illustrated with reference to FIG. 3.

Figure 8:
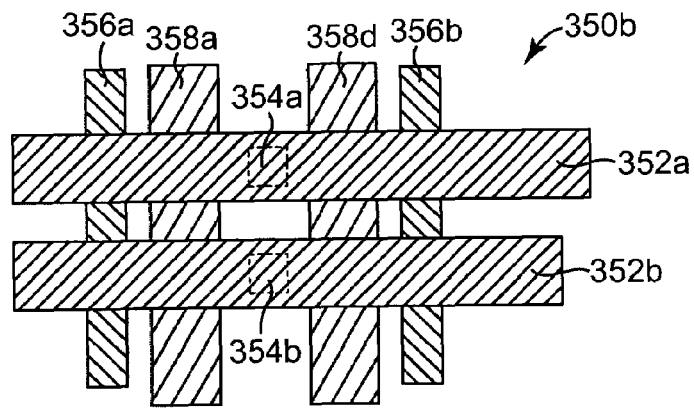
FIG. 8 illustrates a top view of one embodiment of one layer of the embodiment of the stacked phase change memory illustrated in FIG. 7.

FIG. 8 illustrates a top view of one embodiment of a layer 350b of stacked phase change memory 350a. Layer 350b includes vertical common or ground plates 356a and 356b, word lines 358a and 358d, bit lines 352a and 352b, and phase change material super vias 354a and 354b. Any suitable number of layers 350b can be stacked atop each other to provide a three dimensional array of phase change memory cells. Each of the layers 350b share vertical common or ground plates 356a and 356b, bit lines 352a and 352b, and phase change material super vias 354a and 354b.

Bit line 352a is electrically coupled to the top of phase change material super via 354a. Bit line 352b is electrically coupled to the top of phase change material super via 354b. Word line 358a is electrically coupled to the gates of access transistors, such as access transistor 360a. Likewise, word line 358d is also electrically coupled to the gates of access transistors. Common or ground plate 356a is electrically coupled to one side of the source-drain path of access transistors, such as access transistors 360a and 360b. Likewise, common or ground plate 256d is also electrically coupled to one side of the source-drain path of access transistors.

Bit lines 352a and 352b are shared by all layers 350b within stacked phase change memory 350a. In one embodiment, bit lines 352a and 352b are perpendicular to common or ground plates 356a and 356b and word lines 358a and 358d. In another embodiment, bit lines 352a and 352d are parallel to common or ground plates 356a and 356b and word lines 358a and 358d. Bit lines 352a and 352b are in a first interconnect layer. Word lines 358a and 358d are in a second interconnect layer below the first interconnect layer.

Figure 9:
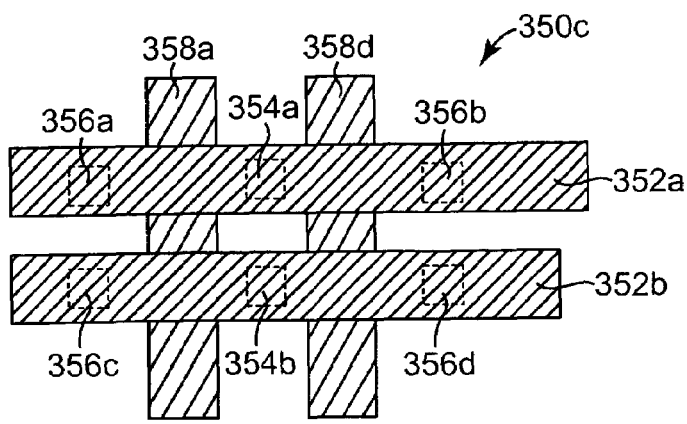
FIG. 9 illustrates a top view of another embodiment of one layer of the stacked phase change memory illustrated in FIG. 7.

FIG. 9 illustrates a top view of another embodiment of a layer 350c of stacked phase change memory 350a. Layer 350c includes common or ground vias 356a-356d, word lines 358a and 358d, bit lines 352a and 352b, and phase change material super vias 354a and 354b. Any suitable number of layers 350c can be stacked atop each other to provide a three dimensional array of phase change memory cells. Each of the layers 350c share common or ground vias 356a-356d, bit lines 352a and 352b, and phase change material super vias 354a and 354b.

Bit line 352a is electrically coupled to the top of phase change material super via 354a. Bit line 352b is electrically coupled to the top of phase change material super via 354b. Word line 358a is electrically coupled to the gates of access transistors, such as access transistor 360a. Likewise, word line 358d is also electrically coupled to the gates of access transistors. Common or ground via 356a is electrically coupled to one side of the source-drain path of access transistors, such as access transistors 360a and 360b. Likewise, common or ground vias 256b-256d are also electrically coupled to one side of the source-drain path of access transistors.

Bit lines 352a and 352b are shared by all layers 350c within stacked phase change memory 350a. In one embodiment, bit lines 352a and 352b are perpendicular to word lines 358a and 358d. In another embodiment, bit lines 352a and 352d are parallel to word lines 358a and 358d. Bit lines 352a and 352b are in a first interconnect layer. Word lines 358a and 358d are in a second interconnect layer below the first interconnect layer.

Embodiments of the present invention provide a stacked phase change memory that provides a three dimensional array of memory cells. The stacked phase change memory increases the bit density of the memory device. The bit density is increased by using a common volume of phase change material to provide multiple storage locations. In addition, the common volume of phase change material can include a stack of different phase change materials or differently doped phase change material regions. Each storage location is accessed by its own access device thereby significantly reducing leakage current during write operations as compared to a cross-point memory array architecture.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A memory comprising:
a volume of phase change material;
a first transistor coupled to the volume of phase change material for accessing a first storage location within the volume of phase change material; and
a second transistor coupled to the volume of phase change material for accessing a second storage location within the volume of phase change material,
wherein the first transistor is in a first layer and the second transistor is in a second layer vertically adjacent the first layer.

2. The memory of claim 1, further comprising:
a third transistor coupled to the volume of phase change material for accessing a third storage location within the volume of phase change material; and
a fourth transistor coupled to the volume of phase change material for accessing a fourth storage location within the volume of phase change material.

3. The memory of claim 1, wherein the volume of phase change material comprises a phase change material super via including a core comprising a material different from the phase change material.

4. The memory of claim 3, wherein the core comprises a stack of at least two different conductive materials.

5. The memory of claim 4, wherein the stack comprises one of a concentrically arranged stack, a horizontal layer stack, and a cone shaped stack.

6. The memory of claim 1, wherein the volume of phase change material comprises a stack of at least two different phase change materials.

7. The memory of claim 6, wherein the stack comprises one of a concentrically arranged stack, a horizontal layer stack, and a cone shaped stack.

8. The memory of claim 1, further comprising:
a first heater contact coupled between the first transistor and the volume of phase change material; and
a second heater contact coupled between the second transistor and the volume of phase change material.

9. A phase change memory comprising:
means for accessing a first storage location;
means for accessing a second storage location; and
means for sharing a common volume of phase change material to provide the first storage location and the second storage location,
wherein the means for accessing the first storage location is in a first layer and the means for accessing the second storage location is in a second layer vertically adjacent the first layer.

10. The memory of claim 9, further comprising:
means for simultaneously accessing the first storage location and the second storage location.

11. The memory of claim 9, further comprising:
means for heating phase change material in the first storage location for changing a state of the phase change material in the first storage location.

12. A method for fabricating a memory, the method comprising:
fabricating a first transistor in a first layer;
fabricating a second transistor in a second layer vertically adjacent the first layer; and fabricating a common volume of phase change material to provide a first storage location for access by the first transistor and a second storage location for access by the second transistor.

13. The method of claim 12, wherein fabricating the common volume of phase change material comprises fabricating a phase change material super via including a conductive material core.

14. The method of claim 12, further comprising:
fabricating a bit line coupled to the volume of phase change material.

15. The method of claim 12, further comprising:
fabricating a ground via coupled to the first transistor and the second transistor.

16. The method of claim 12, further comprising:
fabricating a ground plate coupled to the first transistor and the second transistor.

17. A memory comprising:
a volume of phase change material;
a first transistor coupled to the volume of phase change material for accessing a first storage location within the volume of phase change material;
a second transistor coupled to the volume of phase change material for accessing a second storage location within the volume of phase change material;
a third transistor coupled to the volume of phase change material for accessing a third storage location within the volume of phase change material; and
a fourth transistor coupled to the volume of phase change material for accessing a fourth storage location within the volume of phase change material,
wherein the first transistor, the second transistor, the third transistor, and the fourth transistor are in the same layer.

18. A memory comprising:
a volume of phase change material;
a first transistor coupled to the volume of phase change material for accessing a first storage location within the volume of phase change material; and
a second transistor coupled to the volume of phase change material for accessing a second storage location within the volume of phase change material,
wherein the volume of phase change material comprises a phase change material super via including a core comprising a material different from the phase change material.

19. The memory of claim 18, wherein the core comprises a conductive material.

20. The memory of claim 18, wherein the core comprises a stack of at least two different conductive materials.

21. The memory of claim 20, wherein the stack comprises one of a concentrically arranged stack, a horizontal layer stack, and a cone shaped stack.

* * * * *